(12) United States Patent
Whitbread et al.

(10) Patent No.: US 9,013,785 B2
(45) Date of Patent: Apr. 21, 2015

(54) TUNABLE MULTI-MODE LASER

(75) Inventors: Neil David Whitbread, Northamptonshire (GB); Andrew Cannon Carter, Northamptonshire (GB)

(73) Assignee: Oclaro Technology Limited, Northamptonshire (GB)

( * ) Notice: Subject to any disclaimer, the term of this patent is extended or adjusted under 35 U.S.C. 154(b) by 0 days.

(21) Appl. No.: 14/240,537

(22) PCT Filed: Aug. 24, 2012

(86) PCT No.: PCT/GB2012/052085
§ 371 (c)(1),
(2), (4) Date: Apr. 28, 2014

(87) PCT Pub. No.: WO2013/030549
PCT Pub. Date: Mar. 7, 2013

(65) Prior Publication Data
US 2014/0300953 A1    Oct. 9, 2014

(30) Foreign Application Priority Data

Aug. 26, 2011    (GB) .................................. 1114823.6

(51) Int. Cl.
*H01S 5/12*       (2006.01)
*H01S 5/125*      (2006.01)
*H01S 5/0625*     (2006.01)
*H01S 5/10*       (2006.01)
*H01S 5/04*       (2006.01)
H01S 3/094        (2006.01)
H01S 3/30         (2006.01)
H01S 5/022        (2006.01)
H01S 5/026        (2006.01)

(52) U.S. Cl.
CPC ........... *H01S 5/125* (2013.01); *H01S 3/094096* (2013.01); *H01S 3/302* (2013.01);
(Continued)

(58) Field of Classification Search
CPC ........................................................ H01S 5/12
USPC ........................................ 359/344; 372/50.11
See application file for complete search history.

(56) References Cited

U.S. PATENT DOCUMENTS 7,145,923 B2    12/2006    Carter et al.
7,204,932 B2     4/2007    Johnstone et al.
(Continued)

FOREIGN PATENT DOCUMENTS

EP       1 018 666 A1    7/2000
EP       1 298 767 A2    4/2003
(Continued)

OTHER PUBLICATIONS

Intellectual Property Office of the United Kingdom, Patents Act 1977: Search Report under Section 17(5), United Kingdom Patent Application No. 1114823.6, Dec. 9, 2011, three pages.
(Continued)

Primary Examiner — Mark Hellner
(74) Attorney, Agent, or Firm — Fenwick & West LLP

(57) ABSTRACT

A widely tunable multi-mode semiconductor laser containing only two electrically active sections, being an optical gain section and a tunable distributed Bragg reflector section adapted to reflect at a plurality of wavelengths, wherein the gain section is bounded by the tunable distributed Bragg reflector section and a broadband facet reflector, and wherein the tunable distributed Bragg reflector section comprises a plurality of discrete segments capable of being selectively tuned, wherein the reflection spectra of one or more segments of the tunable distributed Bragg reflector section can be tuned lower in wavelength to reflect with the reflection spectrum of a further segment of the tunable distributed Bragg reflector section to provide a wavelength range of enhanced reflectivity. An optical transmitter comprising a light source that is such a widely tunable multi-mode semiconductor laser.

15 Claims, 7 Drawing Sheets

(52) U.S. Cl.
CPC ............ *H01S 5/02248* (2013.01); *H01S 5/026* (2013.01); *H01S 5/06256* (2013.01); *H01S 5/1096* (2013.01); *H01S 5/1212* (2013.01); *H01S 5/1215* (2013.01); *H01S 2301/16* (2013.01); *H01S 5/041* (2013.01)

(56) References Cited

U.S. PATENT DOCUMENTS

| | | |
|---|---|---|
| 2003/0063647 A1* | 4/2003 | Yoshida et al. ............ 372/50 |
| 2003/0068125 A1 | 4/2003 | Yoshida et al. |
| 2004/0151215 A1 | 8/2004 | Reid et al. |
| 2007/0189348 A1 | 8/2007 | Kovsh et al. |

FOREIGN PATENT DOCUMENTS

| | | |
|---|---|---|
| EP | 1 413 023 | 4/2004 |
| GB | 2 378 315 A | 2/2003 |
| WO | WO 02/075867 A2 | 9/2002 |

OTHER PUBLICATIONS

Patent Cooperation Treaty, International Search Report and Written Opinion, International Patent Application No. PCT/GB2012/052085, Dec. 17, 2012, twelve pages.

Schrans, T., et al., "Tunable active chirped-corrugation waveguide filters," Appl. Phys. Lett., vol. 55, No. 3, Jul. 17, 1989, pp. 212-214 (XP 000046573).

* cited by examiner

TUNABLE MULTI-MODE LASER

The present invention relates to multi-mode pump lasers and more particularly multi-mode pump lasers for Raman amplifiers in fibre-optic communications networks.

BACKGROUND

In this specification the term "light" will be used in the sense that it is used in optical systems to mean not just visible light, but also electromagnetic radiation having a wavelength outside that of the visible range.

Wideband fibre-optic networks use wavelength division multiplexing to operate across a wide wavelength range and a large number of channels, e.g. approximately 100 channels that are arranged at 50 GHz spacings. Standard wavelength ranges defined by the International Telecommunications Union (ITU) for telecommunications include the C and L wavelength bands, which are 191.6-196.2 THz (approximately 1530 to 1565 nm) and 186.4-191.6 THz (approximately 1565 to 1610 nm) respectively.

Optical amplifiers are used to amplify optical signals that have become attenuated through transmission across such fibre-optic links of such networks. Raman amplification is a technique in which high power light is injected into a host material (e.g. an existing span of optical fibre), providing optical gain to optical signals passing through the host material via a stimulated Raman scattering (SRS) process. In optical fibre communications, pump lasers have been used to provide Raman amplification in the optical fibre spans of links.

Pump lasers for Raman amplification typically operate at shorter wavelengths than the wavelength of the optical data signal that requires amplification, e.g. for signals in the ITU C-band, the pump laser typically operates in the range 1440 to 1480 nm. Raman amplification systems may be used independently or alongside other optical amplification systems, such as erbium doped fibre amplifiers (EDFAs).

It is commonly required to provide Raman amplification with an amplification spectrum across the range of operating channels of a fibre-optic link that is tailored to the link, or which is uniform.

Distributed feedback (DFB) pump lasers are used as pump lasers for Raman amplification systems. DFB lasers have a relatively fixed, peaked optical intensity output spectrum, and produce a fixed peaked Raman amplification spectrum. The output spectrum and amplification spectrum of the DFB laser may be thermally tuned over a limited range of no more than a small wavelength range (up to 5 nm).

It is also known to use distributed Bragg reflector (DBR) type pump lasers comprising a gain section and a distributed Bragg reflector having a constant pitch grating. Such DBR pump lasers also have a peaked optical intensity output spectrum centred about a wavelength that corresponds with the pitch of the grating, and produce a peaked Raman amplification spectrum. The effective refractive index of the optical waveguide containing the grating may be tuned, thereby tuning the central wavelength of the reflection spectrum of the DBR, which governs the dominant output wavelength of the laser. However, the range of such wavelength tuning is limited to about 8-10 nm by material considerations, due to the maximum change in the effective refractive index that may be brought about in the material of the waveguide within the DBR section of the laser, and due to the need to allow for manufacturing variations. Accordingly, the output spectrum and Raman amplification spectrum of such DBR lasers may only be tuned over a limited wavelength range.

Due to their peaked Raman amplification spectra, neither a single DFB laser nor a single DBR laser is able to provide a Raman amplification spectrum that is tailored to a particular fibre-optic link, or is uniform. Accordingly, in wideband fibre-optic systems, in order to provide a more desirable amplification spectrum, it is necessary to multiplex a number of such DFB or DBR lasers having different operating wavelengths, which are operated at different intensities to provide an improved Raman amplification spectrum. For example, it is known to use an array of different DFB lasers or DBR lasers that are monolithically integrated and optically coupled through a common optical output.

However, with pump amplification systems having only a small number of multiplexed lasers, each having only a substantially fixed operating wavelength or a limited wavelength tuning range, the ability to optimise the Raman amplification spectrum is limited. Accordingly, to provide an enhanced amplification spectrum would require the multiplexing of a larger number of such lasers, which would increase the redundancy of components, inventory cost and space requirements within physically compact assemblies.

Further, when channels are added or dropped from use in a fibre-optic link, the Raman amplification spectrum of the other channels transmitted across the link will change. Existing Raman amplification systems, using fixed or limited tunability lasers, offer at most only low levels of re-configurability to optimise the Raman amplification spectrum following the adding or dropping of channels. Accordingly, the amplification performance of any particular channel varies, dependent upon which and how many other channels are being used.

SUMMARY OF THE DISCLOSURE

According to a first aspect, there is provided a widely tunable multi-mode semiconductor laser containing only two electrically active sections, being an optical gain section and a tunable distributed Bragg reflector section adapted to reflect at a plurality of wavelengths, wherein the gain section is bounded by the tunable distributed Bragg reflector section and a broadband facet reflector, and wherein the tunable distributed Bragg reflector section comprises a plurality of discrete segments capable of being selectively tuned, and wherein the reflection spectra of one or more segments of the tunable distributed Bragg reflector section can be tuned lower in wavelength to correspond with the reflection spectrum of a further segment of the tunable distributed Bragg reflector section to provide a wavelength range of enhanced reflectivity.

According to a second aspect, there is provided a Raman amplification pump system comprising a light source that is a widely tunable multi-mode semiconductor laser containing only two electrically active sections, being an optical gain section and a tunable distributed Bragg reflector section adapted to reflect at a plurality of wavelengths, wherein the gain section is bounded by the tunable distributed Bragg reflector section and a broadband facet reflector, and wherein the tunable distributed Bragg reflector section comprises a plurality of discrete segments capable of being selectively tuned, and wherein the reflection spectra of one or more segments of the tunable distributed Bragg reflector section can be tuned lower in wavelength to correspond with the reflection spectrum of a further segment of the tunable distributed Bragg reflector section to provide a wavelength range of enhanced reflectivity.

The laser may be configured for lasing on at least five longitudinal cavity modes in use. The laser may be configured for lasing on at least ten longitudinal cavity modes in use. The laser may be configured for lasing on at least fifteen longitudinal cavity modes in use. Advantageously, lasing on a greater number of longitudinal cavity modes decreases the power per cavity mode, thereby reducing nonlinear effects (e.g. stimulated Brillouin scattering) in use when optically pumping a Raman amplifier.

The half-height wavelength range of the intensity of the reflection spectrum of each segment may be greater than five times a corresponding mode spacing of a laser cavity formed with said segment in use. The half-height wavelength range of the intensity of the reflection spectrum of each segment may be greater than ten times a corresponding mode spacing of a laser cavity formed with said segment in use. The half-height wavelength range of the intensity of the reflection spectrum of each segment may be greater than fifteen times a corresponding mode spacing of a laser cavity formed with said segment in use. Advantageously, the greater breadth of the reflection spectrum enables lasing on a greater number of longitudinal cavity modes, which decreases the power per cavity mode, thereby reducing nonlinear effects (e.g. stimulated Brillouin scattering) in use when optically pumping a Raman amplifier.

The widely tunable multi-mode semiconductor laser may comprise regions without electrical contacts or gratings bounded by the tunable distributed Bragg reflector section and the broadband facet reflector, having a composite length of at least 100 μm.

The widely tunable multi-mode semiconductor laser may comprise an electrically passive section bounded by the tunable distributed Bragg reflector section and the broadband facet reflector, the electrically passive section having a length of at least 100 μm.

The segments of the tunable distributed Bragg reflector section each comprise a segment of grating and the segments of the tunable distributed Bragg reflector section may be arranged with a monotonic variation of grating pitch along the length of the tunable distributed Bragg reflector section.

The tunable distributed Bragg reflector section may comprise a chirped grating.

The tunable distributed Bragg reflector section may be a linearly chirped grating.

The grating has a pitch, and may be chirped such that the inverse of the pitch varies linearly along the length of the grating.

The grating may comprise chirped grating segments that do not provide a contiguous range of grating pitches. For example, the chirped grating segments may have ranges of grating pitches that partially overlap the ranges of grating pitches of other grating segments, in the un-tuned state. Alternatively, the grating may have chirped grating segments that have non-adjacent ranges of grating pitches, such that there are gaps within the overall pitch range of the grating that are not provided by any grating segment (i.e. a gap is provided between the ranges of pitches of grating segments of successive pitch ranges).

The segments of the tunable distributed Bragg reflector section may each comprise a segment of grating of constant pitch.

The tunable distributed Bragg reflector section may comprise at least three discrete segments capable of being selectively tuned. The tunable distributed Bragg reflector section may comprise at least six discrete segments. The tunable distributed Bragg reflector section may comprise at least eight discrete segments. The tunable distributed Bragg reflector section may comprise at least ten discrete segments.

The widely tunable multi-mode semiconductor laser may be monolithically integrated with an optical splitter, configured to split light output from the laser into two waveguide arms, a polarisation rotator on one of the waveguide arms, and a semiconductor optical amplifier on each waveguide arm.

BRIEF DESCRIPTION OF THE DRAWINGS

Embodiments of the invention are further described hereinafter with reference to the accompanying drawings, in which.

DETAILED DESCRIPTION

In the described embodiments, like features have been identified with like numerals, albeit in some cases incremented by integer multiples of 100. For example, in different figures, 100 and 400, 500, 600 and 700 have been used to indicate a tunable multi-mode laser.

Figure 1:
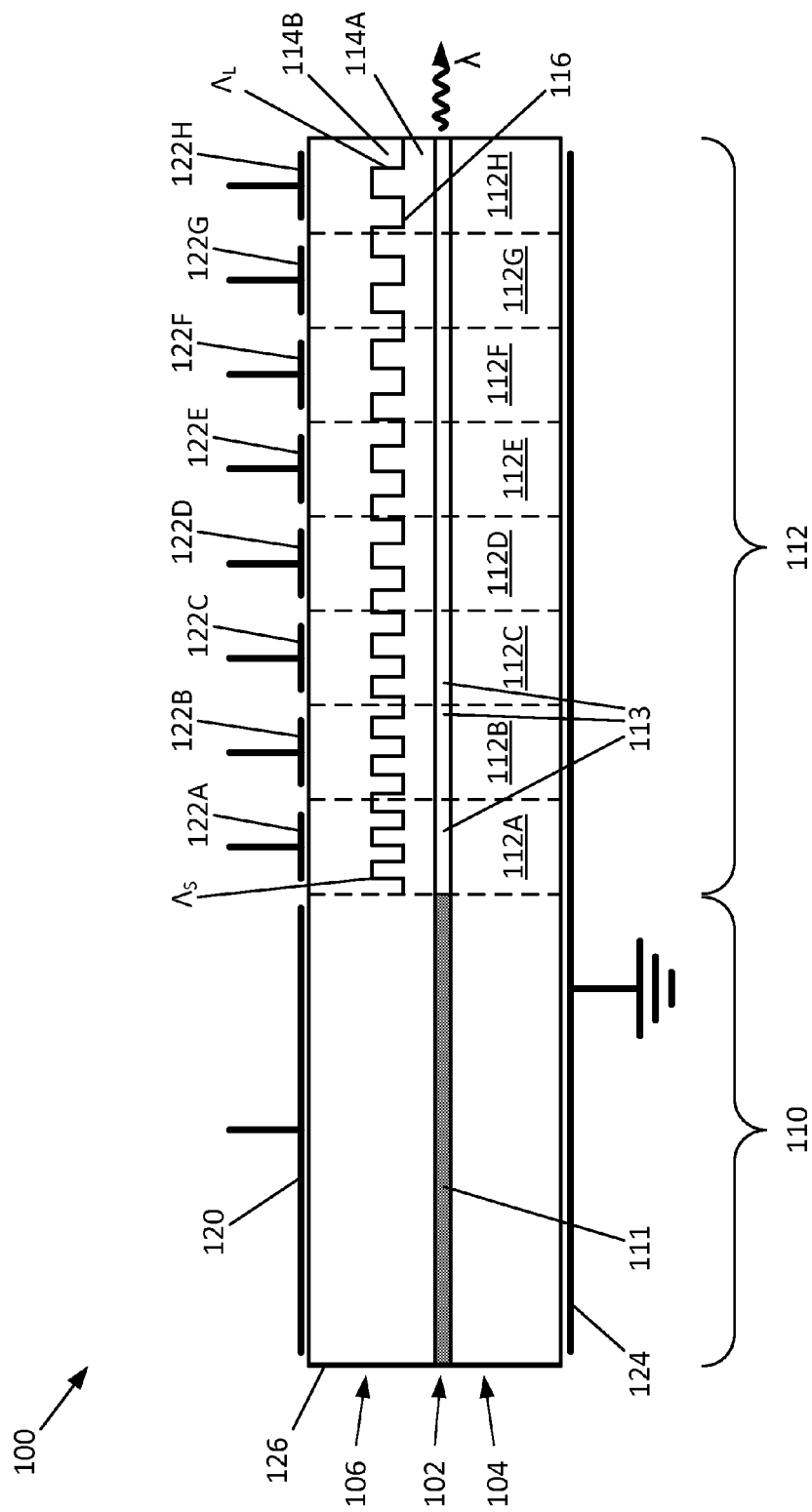
FIG. 1 schematically illustrates a laser according to a first embodiment.

FIG. 1 shows a schematic cross sectional view of a tunable multi-mode laser 100 in accordance with a first embodiment. As is conventional in semiconducting lasers, the laser is built up in a series of layers, with an optical waveguide layer 102 formed between a lower layer 104 and an upper layer 106. Further layers are omitted for the purposes of clarity.

The tunable multi-mode laser 100 has two electro-optically active sections, being a gain section 110 and a tunable distributed Bragg reflector (DBR) section 112. The gain section 110 is driven to produce optical gain within a laser cavity between part of the DBR section 112 and a broadband facet reflector 126. The DBR section 112 comprises a plurality of DBR segments 112A to 112H for selective tuning of the DBR segments, for spectral cooperation between their respective reflection spectra, to control the lasing wavelengths of the laser cavity. In such operation, only some of the DBR segments 112A to 112H may be tuned, whilst the other DBR segments are undriven (e.g. no current injection).

The gain section 110 and DBR section 112 share a common lower layer 104 (e.g. n-type semiconductor), and may share a common upper layer 106 (e.g. p-type semiconductor). The optical waveguide layer 102 comprises undoped material (i.e. not intentionally doped, intrinsic material) 111 and 113. Within the optical waveguide layer 102, the gain section 110 comprises material 111 adapted to produce optical gain when driven by carrier injection, and the DBR section 112 comprises material 113 configured to produce refractive index change (e.g. also when driven by carrier injection). The upper layer 106 in the DBR section 112 comprises a first upper layer 114A and a second upper layer 114B of different refractive indices, with a distributed Bragg reflector grating 116 provided by a corrugated interface formed between the first and second upper layers. Although illustrated schematically as a simple castellation, the physical shape of the grating 116 is dependent upon the etching process that is used to form the grating into the first upper layer 114A prior to overgrowth with the second upper layer 114B of the DBR section 112.

The grating 116 is a chirped grating, in which the grating has a pitch $\Lambda$ that varies monotonically along the length of the grating, e.g. increases continuously along the length of the grating away from the gain section, from $\Lambda_S$ to $\Lambda_L$. In the tunable multi-mode laser illustrated in FIG. 1, the grating is chirped such that the inverse of the pitch of the grating varies linearly along its length, (i.e. chirp varies linearly with respect to $\Lambda^{-1}$). For a small pitch variation, the chirp may be regarded as being such that the pitch varies approximately linearly along the length of the grating. The DBR section 112 comprises a series of DBR segments 112A to 112H, each DBR segment being configured for cooperation with another DBR segment. Each DBR segment 112A and 112H comprises a segment of the grating 116, and the pitch of the grating segments changes monotonically along the series of DBR segments. The variation in pitch of the grating 116 shown in the figures has been exaggerated for the purposes of clarity. For example, in a laser having an operating range from 1530 to 1570 nm, variation in pitch along the length of the grating 116 would be less than 3%.

An electrode 120 is provided on the gain section 110 for passing current through the gain section 110. An individually selectable electrode 122A to 122H is provided on each of the segments of the DBR section 112 for passing current through each DBR segment 112A to 112H to tune the refractive index of the respective DBR segment. The DBR segments 112A to 112H are configured to reflect light having a wavelength (or range of wavelengths) that is approximately twice the effective pitch (or range of effective pitches) of the grating provided within the DBR segment, and the effective pitch of the grating within each DBR segment can be tuned by tuning the refractive index of the material 113 in the waveguide layer 102 within that DBR segment. Although the DBR segments 112A to 112H are independently electrically controllable through the segmented electrodes 122A to 122H, they form a single composite active section 112 of the laser 100, having respective optical reflection spectra that can be tuned cooperatively, in use, in a substantially additive manner. A common electrode 124 is provided on the opposite side of the device, which may be electrically grounded.

The laser is configured to be operable to define a lasing cavity between part of the DBR section 112 and a facet reflector 126, i.e. a broad bandwidth reflection from a facet of the semiconductor chip on which the laser 100 is formed. The facet will typically be provided with a coating (not shown) to provide a known reflectivity. In the case that the optical output $\lambda$ is emitted through the DBR section 112 (as in the case of the laser of FIG. 1) the facet coating may be a high reflectivity coating.

The evanescent tail of a lightwave travelling along the optical waveguide 102 within the DBR section 112 will overlap with the grating 116. A portion of the grating 116 having a physical pitch of $\Lambda_0$ has an effective pitch of $\Lambda_{eff} = n_{eff} \Lambda_0$, where $n_{eff}$ is the refractive index of the waveguide, as experienced by the light propagating along it. (Conversely, light having a free space wavelength of $\lambda_0$ has an effective wavelength of $\lambda_{eff} = \lambda_0/n_{eff}$ within the optical waveguide.) The grating 116 acts as a reflector for light having a free space wavelength that is equal to twice the effective pitch of the grating (this applies for a first order reflector, although it is also known to use such gratings as higher order reflectors).

The method of operation of the multi-mode pump laser 100 is more readily understood by reference to FIGS. 2A to 3D.

Figure 2A:
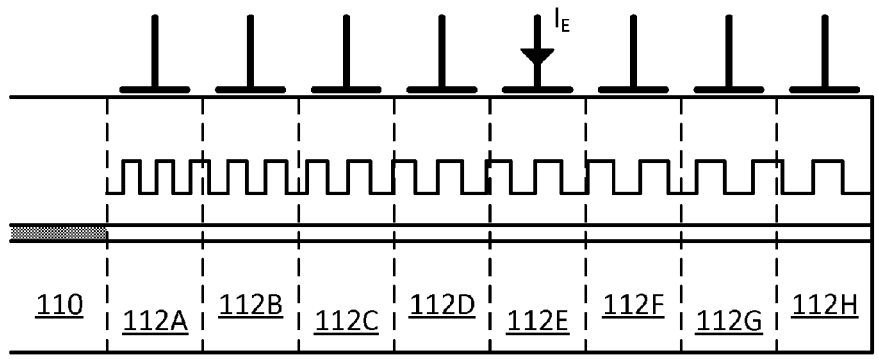
FIGS. 2A to 2D illustrate operation of the first embodiment in the passive state and in a first tuned state.
Figure 2B:
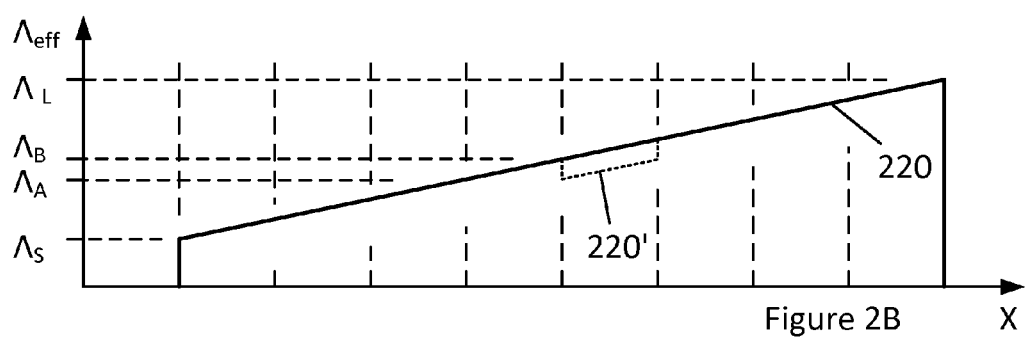
Figure 2C:
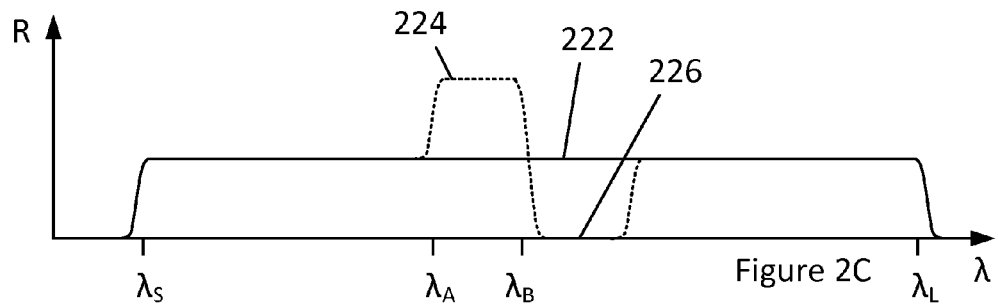

In the passive state, each grating segment 112A to 112H of the DBR section 112 has a different effective pitch $\Lambda_{eff}$ (i.e. the physical pitch, multiplied by the effective refractive index for light in the laser's optical resonant cavity), together covering a range of effective pitches 220 from $\Lambda_S$ to $\Lambda_L$ as shown in FIG. 2B. Accordingly, the DBR section 112 has a composite reflection spectrum 222 and reflects light across a wide range of free space wavelengths, as shown in FIG. 2C, e.g. a substantially uniform reflectivity across the whole of the C-band. For a chirped grating, continuously varying in pitch from a shortest pitch $\Lambda_S$ to a longest pitch $\Lambda_L$, the reflection spectrum will cover light having a free space wavelength range of approximately $\lambda_S = 2 n_{eff} \Lambda_S$ to $\lambda_L = 2 n_{eff} \Lambda_L$.

In use, to produce a multi-mode optical output, it is necessary both to have a population inversion of charge carriers within the gain material of the gain section 110 and to reduce the round trip optical loss of a range of wavelengths that covers several longitudinal modes of a cavity of the laser, so that the modes are raised above the lasing threshold. This is achieved by providing sufficient power to the gain section 110 and by selectively tuning the reflection spectra of segments of the DBR section 112, making the DBR section preferentially reflect light at a selected range of wavelengths 224, which enables the laser to commence lasing on cavity modes of the laser that correspond with the selected range of wavelengths.

To produce a preferential reflection at a range of wavelengths 224, the reflection spectrum of at least one DBR segment 112E is tuned to correspond (i.e. spectrally overlap) with the reflection spectrum of a further DBR segment 112D, to provide a wavelength range $\lambda_A$ to $\lambda_B$ of enhanced reflectivity, i.e. the reflection spectrum of the at least one DBR segment 112E is tuned to partially or fully spectrally overlap with the reflection spectrum of the further DBR segment 112D. The tuning operation is as follows. The material 113 from which the waveguide layer 102 within the DBR section 112 is formed is configured to experience a reduction in refractive index when an electrical current is passed through it. Accordingly, by passing an electric current $I_E$ through a DBR segment 112E, the refractive index of that DBR segment is tuned, and consequently the effective pitch of the grating within that DBR segment is also tuned, so that the range of wavelengths over which that DBR segment reflects light will also be tuned. Thus if a current $I_E$ is passed through the electrode 122E, the wavelength range over which the grating of the corresponding DBR segment 112E reflects light will be shifted towards shorter wavelengths.

As illustrated by the dotted line 220' in FIG. 2B, by reducing the refractive index of the DBR segment 112E, it is possible to reduce the effective pitches $\Lambda_{eff}$ of the corresponding segment of the grating 116 such that it fully overlaps with the range of effective pitches of the DBR segment 112D. Accordingly, in this tuned state, both DBR segments 112E and 112D will reflect light over the same range of wavelengths, providing a reinforced region 224 within the reflection spectrum of the DBR section 112, as shown by the dotted line in FIG. 2C. There will also be a complementary wavelength range 226 at a higher wavelength that has a reduced reflectivity within the reflection spectrum of the DBR section 112.

The presence of the reinforced reflective wavelength range 224 of the DBR section 112 provides a reduced round-trip optical loss for light within a laser cavity formed between the broadband facet reflector 126 and the corresponding DBR segments 112E and 112D. Accordingly, if current is passed through the gain section 110 from the electrode 120 to create light in the gain section of sufficient intensity, longitudinal modes of the laser cavity corresponding to the reinforced reflectivity wavelength range 224 will lase, producing a multi-mode optical output 228, as illustrated in FIG. 2D.

Figure 2D:
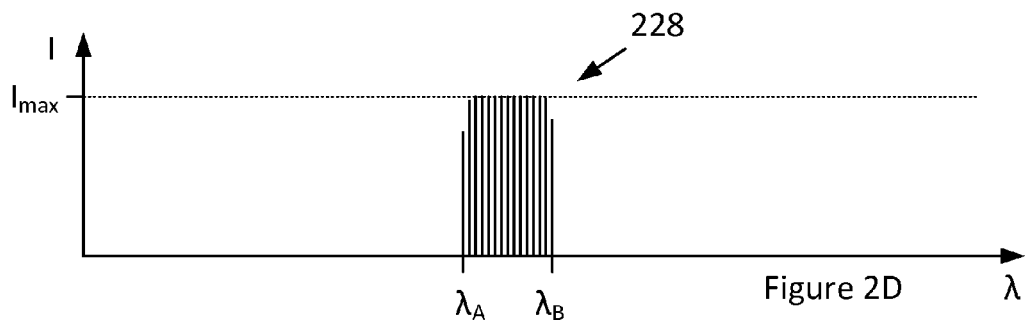

An advantage of this laser design is that the breadth of the reinforced reflective peak 224 is sufficiently broad that many longitudinal modes of the laser cavity may be simultaneously brought above the lasing threshold, in order to produce a broad multi-mode optical output 228, as is illustrated in FIG. 2D. The multi-mode optical output 228 comprises at least five lasing longitudinal cavity modes, and preferably at least ten modes, or more preferably at least fifteen modes. A longitudinal cavity mode is considered to lase if the mode has an output intensity of at least 10% of the maximum intensity mode $I_{max}$.

Such a multi-mode optical output 228 is particularly suitable for use in Raman amplification systems, since it provides a lower power spectral density on each lasing longitudinal mode of the laser cavity, which reduces optical nonlinear effects occurring within the optical transmission fibre, and consequently enables the transmitted light channel to penetrate further along the pumped fibre-optic link.

The wavelength range (as measured at the half-height (i.e. −3 dB) intensity of the reflection spectrum) of the grating segment in each DBR segment 112A to 112H corresponds with the effective pitch range of the grating segment. The wavelength range of each grating segment 112A to 112H is greater than five times the mode spacing of the longitudinal cavity modes (e.g. it is greater than five times the free spectral range/FSR of the laser cavity), and preferably greater than ten times the mode spacing, or more preferably greater than fifteen times the mode spacing.

The mode spacing of the laser cavity in the middle wavelength $\lambda_0$ of the operating wavelength range is approximately given by:

$$\Delta\lambda_{mode} = \lambda_0^2 / 2 n_{eff} L_{cavity}$$

where $n_{eff}$ and $L_{cavity}$ are the effective refractive index and effective laser cavity length at $\lambda_0$. The mode spacing varies as a function of the length of the laser cavity formed, which dependent upon which DBR segments 112A to 112H are spectrally tuned into correspondence to provide the reduced round-trip cavity loss. The mode spacing at the mid-point of the operating range of the laser is typically between 0.1 and 0.5 nm (given by the spectral overlap of segments having gratings in approximately the mid-point of the range of grating pitches).

By suitable choice of which DBR segments to tune together to produce a reinforced reflective wavelength range, it is possible to select different parts of the whole operating range of the laser in which to excite the multi-mode laser output.

It will be appreciated that as the segments of the DBR section 112 cannot be tuned to longer wavelengths by this method, the longest wavelength range at which the laser can lase is approximately that of the penultimate DBR segment 112G, with which the final DBR segment 112H can be tuned into correspondence.

Figure 3A:
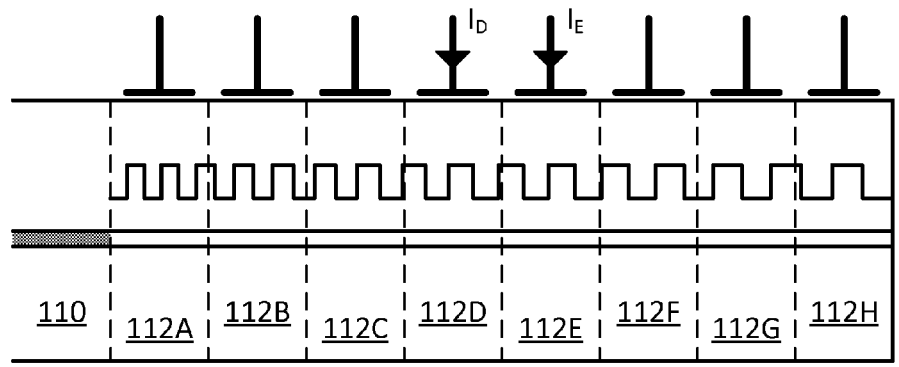
FIGS. 3A to 3D illustrate operation of the first embodiment in a second tuned state.
Figure 3B:
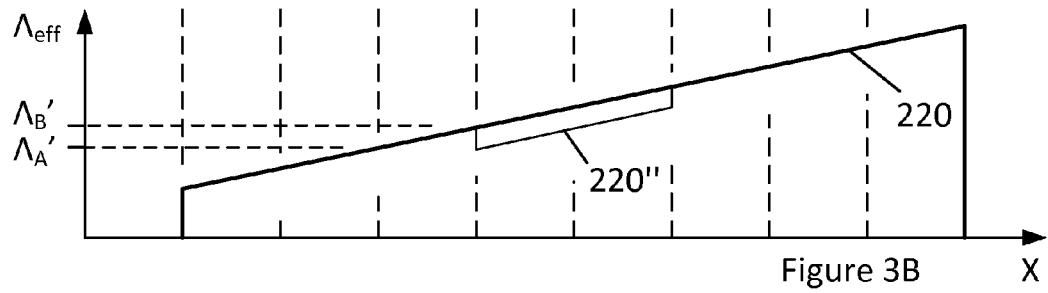
Figure 3C:
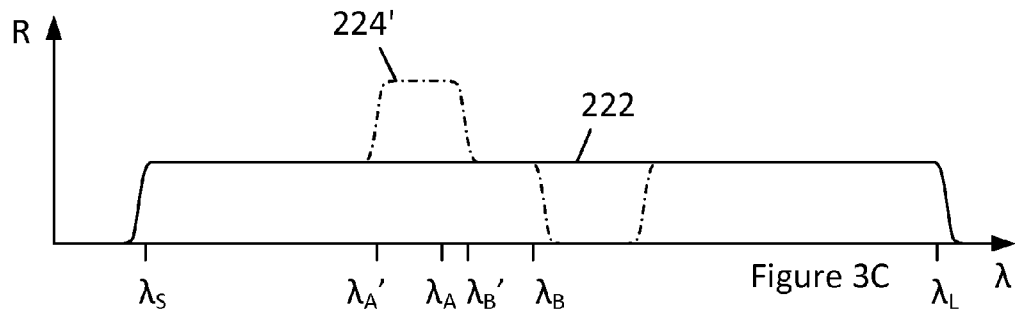
Figure 3D:
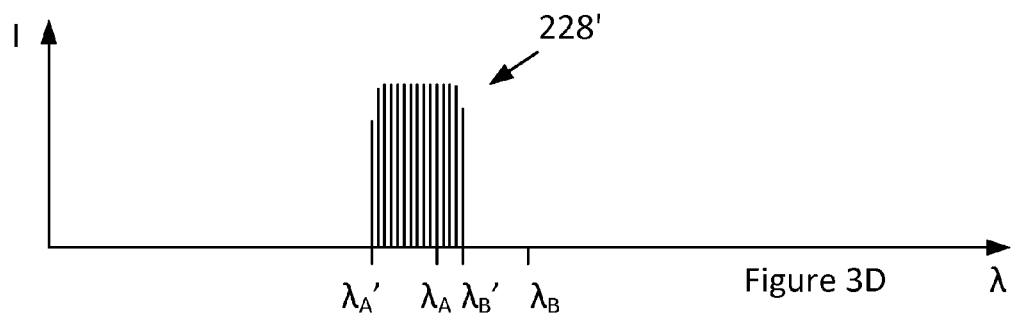

Fine tuning of the wavelength range of the laser output can be achieved by simultaneously tuning spectrally adjacent DBR segments. For example, if a current $I_D$ is passed through a second, adjacent DBR segment 112D in addition to maintaining the current $I_E$ passing through the first DBR segment 112E, the effective pitches of both grating segments are tuned together as shown in FIG. 3B, and the reinforced reflective wavelength range 224 will be tuned to a range of shorter wavelengths 224', as shown in FIG. 3C. Accordingly, the multi-mode optical output 228 of the laser is tuned to a lower range of wavelengths 228', corresponding with the reinforced reflectivity wavelength range 224', as illustrated in FIG. 3D.

The laser consists of only two active sections, being a gain section and a tunable distributed Bragg reflector (which comprises a plurality of segments). Accordingly, only two active sections are required for operation of the widely tunable multi-mode semiconductor laser, namely the gain section and tunable distributed Bragg reflector section. The laser functions to produce a multi-mode optical output with only the two sections, although in some embodiment the laser may additionally have at least one passive section (configured not to be electrically drivable, being a section without a grating that is not provided with an electrode) within the optical cavity bounded by the DBR section and facet reflector. In some embodiments the laser may be integrated with other optical components outside of the laser cavity, such as a semiconductor optical amplifier (SOA), which serves to amplify the multi-mode light after it has been emitted from the laser cavity, and passed through a reflector (e.g. having passed through the DBR section in the case that it is partially transmissive).

Accordingly, no active section is required for phase control (i.e. no phase control section), in contrast to widely tunable semiconductor lasers configured for operation on only a single longitudinal cavity mode, for which it is typically important to avoid jumping between operation on different laser cavity modes ("mode-hopping"). Advantageously, due to the multi-mode operation of the laser, accurate phase control of the laser cavity, in order to control the comb of potential laser cavity modes (which correspond to wavelengths for which the effective laser cavity length is an integer multiple of half the effective wavelength of the mode in the cavity) is not required to maintain stability of output power for use in Raman amplification.

In use for Raman amplification, advantageously, any embodiment of the present tunable multi-mode laser may be tuned to emit at a range of pumping wavelengths across a plurality of laser cavity modes in correspondence with the transmission channel wavelength of the single mode optical data signal that requires to be amplified (i.e. tuned so that the wavelength of the single mode optical data signal spectrally falls within the range of the multi-mode optical output of the pump laser). This enables optimisation of the optical gain spectrum in correspondence with the wavelengths of the optical data signals. Accordingly, use of a plurality of widely tunable pump lasers according to any embodiment, within a Raman amplification system, can enable a superior tailoring of the amplification spectrum and superior responsiveness to the adding and dropping of transmission channels. Further, a pump laser of an embodiment can enable a reduction in the redundancy of pump lasers in optical networks, a reduction in inventory costs to network operators, and a reduction in the space required to provide the Raman amplification system.

To ensure complete band coverage, out-of-band or edge-of-band segments can be employed. The long wavelength out-of-band DBR segment 112H with a tuning electrode 122H may be provided, so that it can, by means of current injection, be driven to coincide with the first in-band long wavelength DBR segment 112G. A short wavelength out-of-band segment 112A may be provided, which may not need to be provided with an electrode as its operation may be determined by driving current through the shortest wavelength in-band DBR segment 112B. However, the short wavelength out-of-band DBR segment 112A does need to be provided with an electrode 122A if is required to be fine tuned.

Incorporation of these out-of-band or edge-of-band DBR segments 112A and 112H allows for manufacturing variations (i.e. production spread in the operating characteristics) and consequently helps improve production yields.

With InP, which is a typical Group III-V laser material, the reduction in material refractive index that can be created through current injection would typically enable wavelength tuning of the reflection from each DBR segment 112A to 112H by up to approximately 10 nm. Using such material the DBR segments will typically be arranged to cover (free space) wavelength ranges at 4 to 10 nm intervals. With such an arrangement, to produce coincidence with its next lowest wavelength neighbour requires 4 nm (free space) wavelength shift of the reflection from a DBR segment, whilst leaving a further 4 nm coincident tuning capability (i.e. enabling the first DBR segment to be tuned together with a further DBR segment having an adjacent, lower wavelength range in the passive state). By this means the tunable multi-mode laser may be tuned to operate across a broad wavelength band of interest. In particular, the laser may be termed a "widely tunable multi-mode laser", as it is able to tune across a greater range of wavelengths than a DBR laser that is limited by the tuning range of the waveguide material, which is refractive index limited, as is the case with a pump laser having a single pitch DBR.

FIG. 1 illustrates an arrangement in which multi-mode light is emitted from the laser 100 through the DBR section 112. A less intense, secondary emission of light may also pass through the broadband facet reflector 126, which may be used for monitoring purposes. Alternatively the laser 100 may be configured to emit a primary multi-mode output through the broadband facet reflector 126, and optionally a secondary emission may pass through the DBR section 112 for monitoring purposes.

Figure 4:
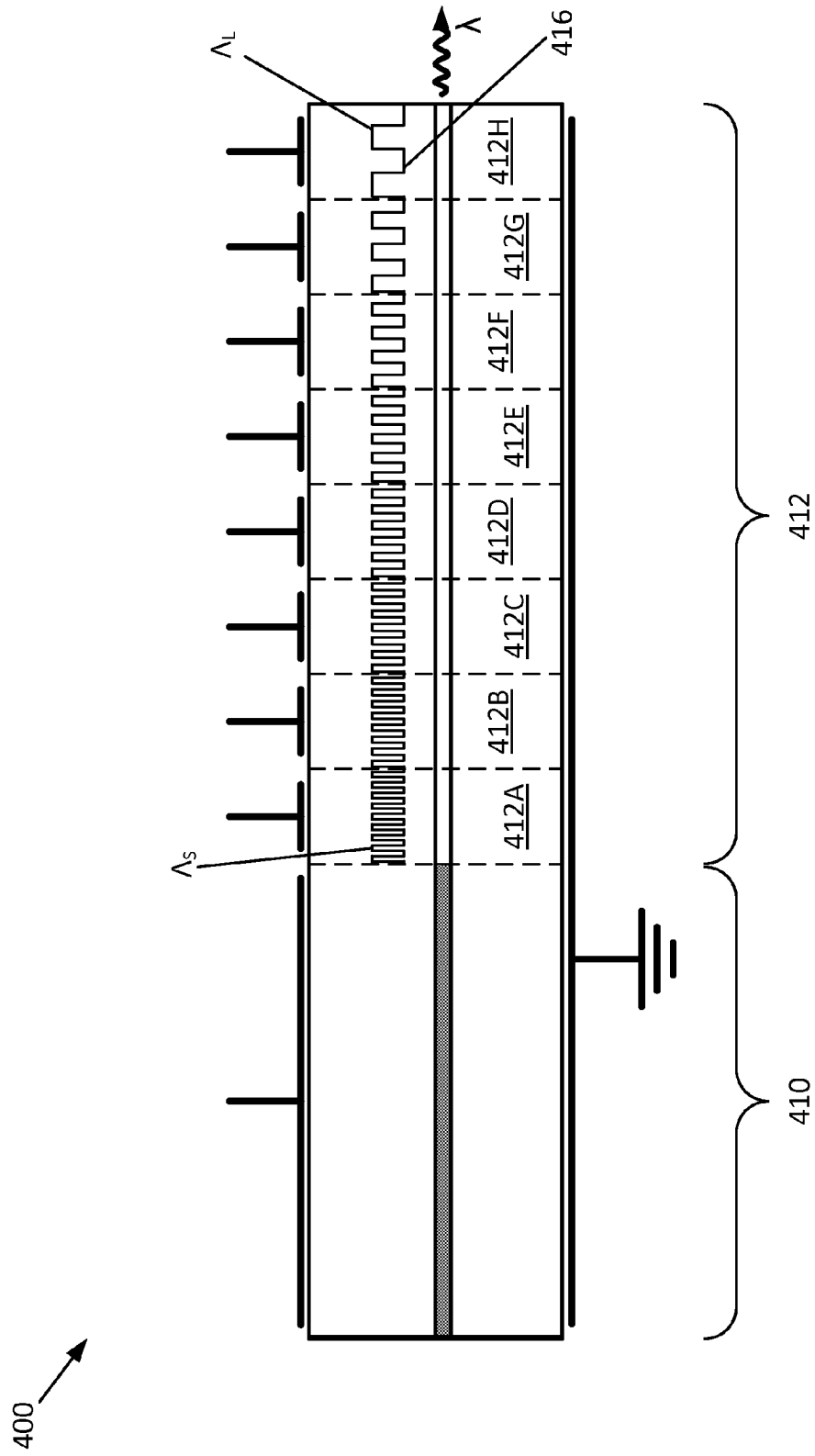
FIG. 4 schematically illustrates a laser according to a second embodiment.

The pitch of the grating may vary discontinuously between the shortest grating pitch $\Lambda_S$ and the longest grating pitch $\Lambda_L$, as shown in FIG. 4. The DBR segments may each have a constant pitch. The DBR segments 412A to 412H of the multi-mode laser 400 form a monotonically stepped series of constant pitch grating segments.

In alternative embodiments, the grating may comprise chirped grating segments that do not provide a contiguous range of grating pitches, i.e. there may be gaps or overlaps in the pitch ranges of grating segments of successive pitch ranges, in the un-tuned (passive) state.

The DBR section 112 illustrated in FIG. 1 (and later figures) has eight tunable DBR segments having segments of grating 116 of different pitches, in the passive state. However, FIG. 1 is schematic and other numbers of DBR segments may be provided. There must be at least three DBR segments having segments of grating of different pitches, and typically more than five DBR segments will be provided. More than eight DBR segments may be provided, for example twelve segments arranged at 4 nm spacings may be provided.

Within the laser cavity there is no phase control section, providing a low complexity device to manufacture and low complexity operational control.

It is preferred that the reflectivity of the broadband facet reflector 126 is as high as possible, typically being >90% across the operating spectrum of the laser 100. On the other hand the reflectivity of the DBR section should be lower, and typically in the range 20% to 40%, when untuned.

Figure 5:
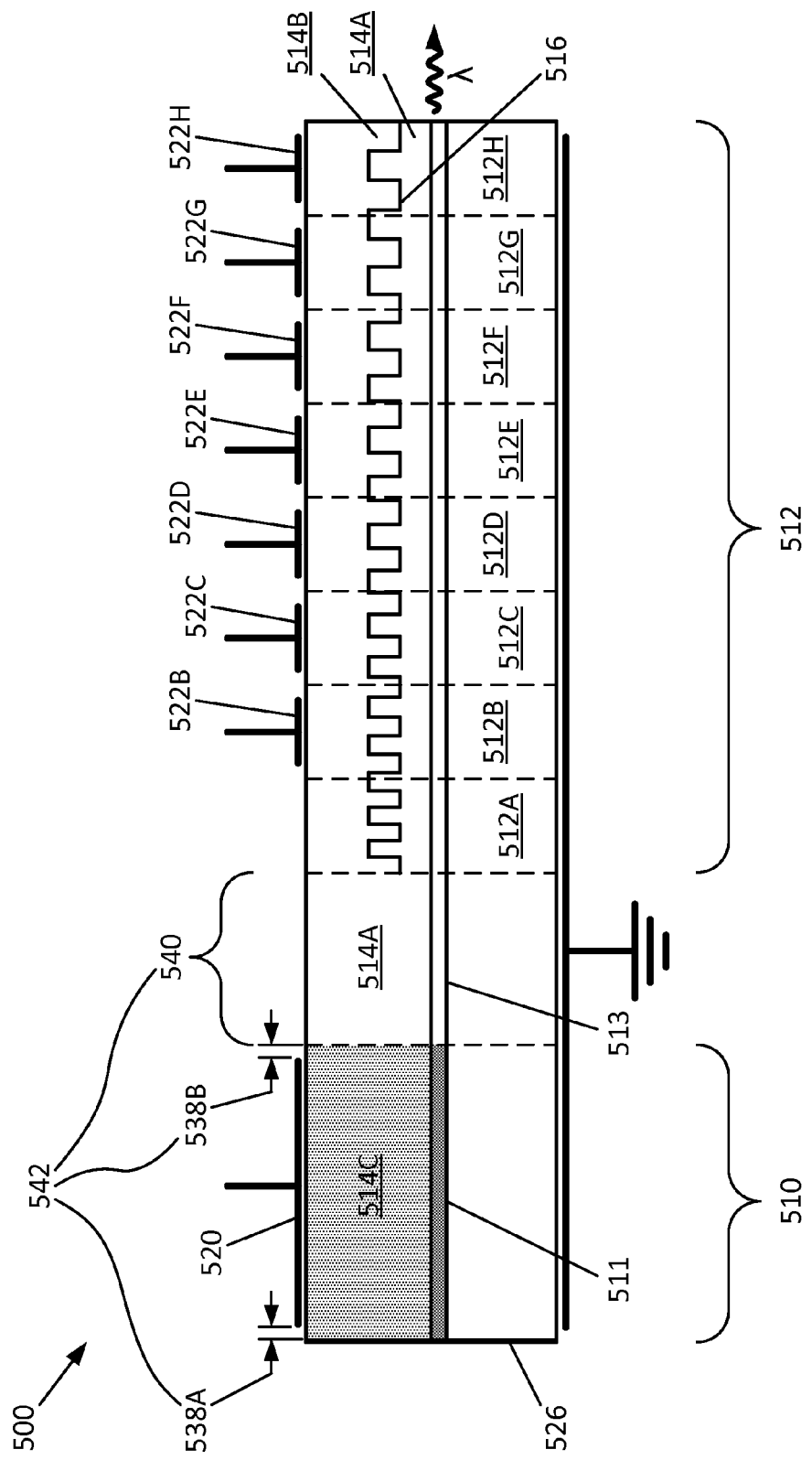
FIG. 5 schematically illustrates a laser according to a third embodiment.

The current passed between the electrodes (e.g. 120 and 122A to 122H) on the gain section and segments of the DBR section and the back electrode 124 typically spreads by a few µm (i.e. less than 20 µm). The extent of this current spreading is dependent upon the epitaxial structure of the corresponding sections. Accordingly, the gain section electrode 120 and 520 stops short of the edges of the gain section 110 and 510, to allow for corresponding electrical isolation gaps 538A and 538B (only labelled in FIG. 5), as is indicated in FIG. 5. The figures are schematic and not to scale, and accordingly exaggerate both the thickness of the epitaxially grown layers and the width of the electrical isolation gaps, for clarity.

Materially, the gain section 510 differs from the DBR section 512 and any passive section 540 with respect to at least one epitaxial layer, e.g. differing with respect of the material 511 and 513 of their respective optical waveguide layers 502. Additionally, the gain section 510 may comprise a different material in the lower layer 504 and/or a different material 514C in the upper layer 506 (as illustrated, in FIG. 5).

FIG. 5 illustrates a multi-mode laser 500 that differs from that of the laser 100 in FIG. 1 by the additional provision of a passive waveguide section 540. The passive waveguide section 540 is not configured to be electrically controlled, i.e. no electrical contact is provided to the upper surface, and it is configured such that no current may be passed through the passive waveguide section 540 (i.e. it is spaced apart from the part of the gain section 510 covered by gain section electrode 520 by a narrow electrical isolation gap 538B, within which current from the gain section electrode 510 spreads). The passive waveguide section 540 is preferably substantially optically transparent to light within the laser cavity. The passive waveguide section 540 is shown located between the gain section 510 and the DBR section 512, although alternatively or additionally a passive waveguide section could be provided between the gain section and the broadband facet reflector 526. Accordingly, bounded by the broadband facet reflector 526 and the DBR section 512, the laser cavity (in use) of the multi-mode laser 500 is provided with a composite region 542 that is not provided with an electrical contact (either a metal electrode or highly doped contact region) or a grating, composed of electrical isolation gaps 538A and 538B and the passive waveguide section 540. The composite region 542 has a length of at least 100 µm, and preferably the passive section 540 alone has a length of at least 100 µm.

The inclusion of a passive waveguide section can be used to extend the length of the laser cavity (FIG. 5 is schematic and not to scale), such that the longitudinal modes (single transverse modes) of the laser cavity are more closely spaced, which may increase the number of lasing modes falling within the reinforced reflection range formed by tuning the reflection spectra of DBR sections to overlap.

Although in the lasers illustrated in FIGS. 1, 2A, 3A and 4, segmented electrodes are provided on each of the segments of the DBR sections, one or more electrodes may be omitted from the segments at one or both ends of the DBR section. In particular, the electrode (e.g. 112A) or electrodes (e.g. 112A and 112B) may be omitted from the DBR segment or segments in which the grating 116 has the shortest pitch (when not driven).

In FIG. 5, the electrode is omitted from the DBR segment 512A in which the grating 516 has the shortest pitch (when not driven). Although not provided with an electrode, by which to be electrically controlled, DBR segment 512A is nonetheless regarded as part of the active DBR section, since the reflection spectra of one or more other DRB segments (e.g. segments that are spectrally adjacent when not driven, 512B and 512C) may be tuned into spectral cooperation with it.

Within a Raman amplification system, the tunable multi-mode pump laser will typically be optically coupled with other components, prior to the multi-mode pump signal being launched into the optical fibre network. For example, a tunable multi-mode pump laser may be integrated with semiconductor optical amplifier (SOA) to boost the output power from an electro-optical module.

Figure 6:
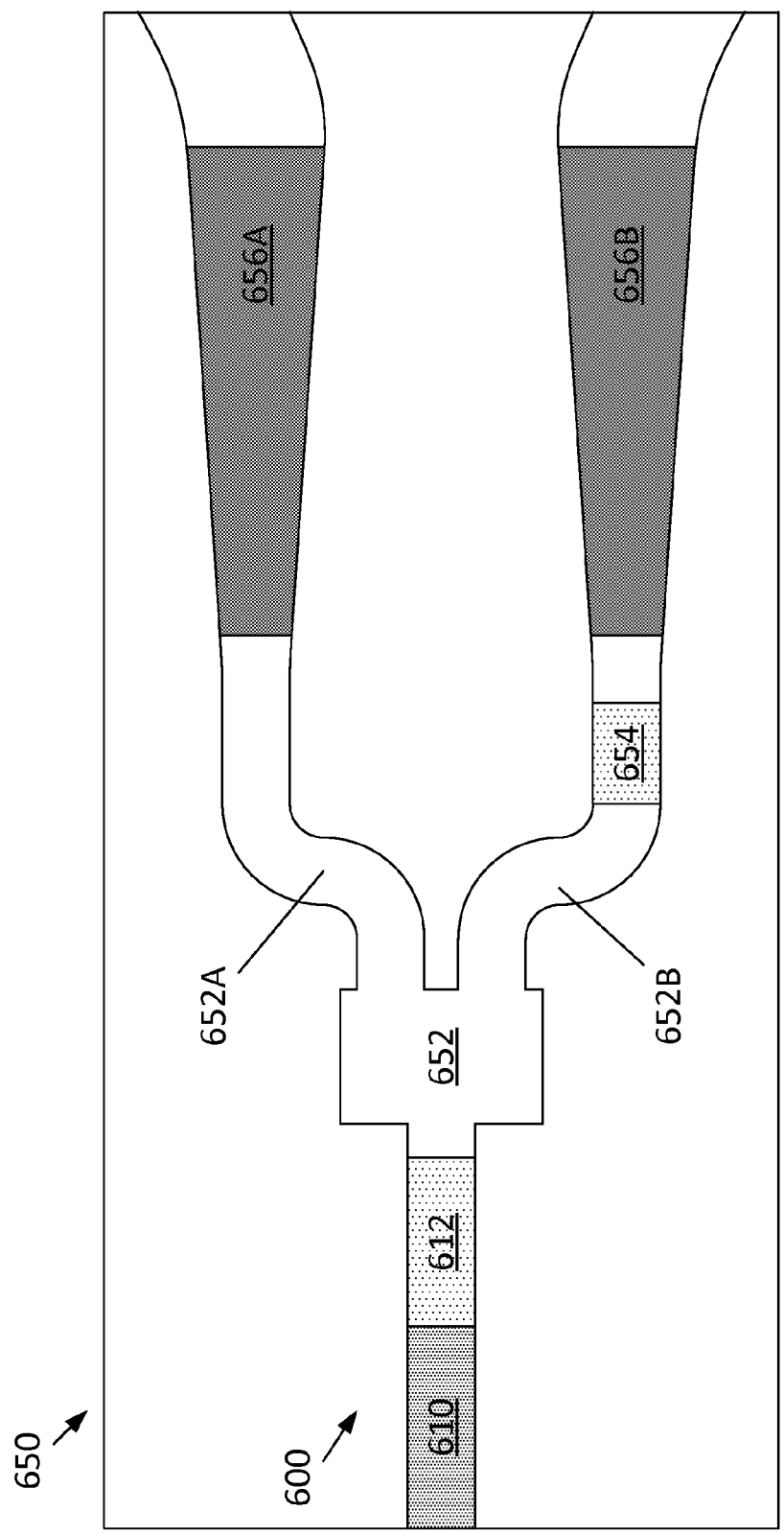
FIG. 6 schematically illustrates a tunable multi-mode laser monolithically integrated with a pair of semiconductor optical amplifiers (SOAs) and a polarisation rotator.

A polarisation independent Raman amplification signal may be provided by combining a pair of optical signals having orthogonal polarizations. FIG. 6 illustrates, in plan view, a semiconductor chip 650 on which the tunable multi-mode laser 600 is integrated with an optical splitter 652, a polarisation rotator 654 and a pair of SOAs 656A and 656B.

The optical splitter 652 may be a 1×2 multi-mode interference (MMI) coupler, which splits the output from the laser 600 into two waveguide arms with equal intensities. The polarisation rotator 654, which is provided on only one of the waveguide arms, may be of the type described in U.S. Pat. No. 7,204,932. The SOAs 656A and 656B amplify the orthogonal optical signals that pass along each waveguide, and are flared outwardly along their length towards the output facet. S-shaped waveguides 658A and 658B are provided before the SOAs 656A and 656B to space the waveguide arms apart in the SOAs. To reduce back-reflections, the output facet has an anti-reflection coating, and the ends of the waveguide arms are non-perpendicular to the output facet, being angled away from each other, which also facilitates optical coupling to the optical outputs, off-chip.

Figure 7:
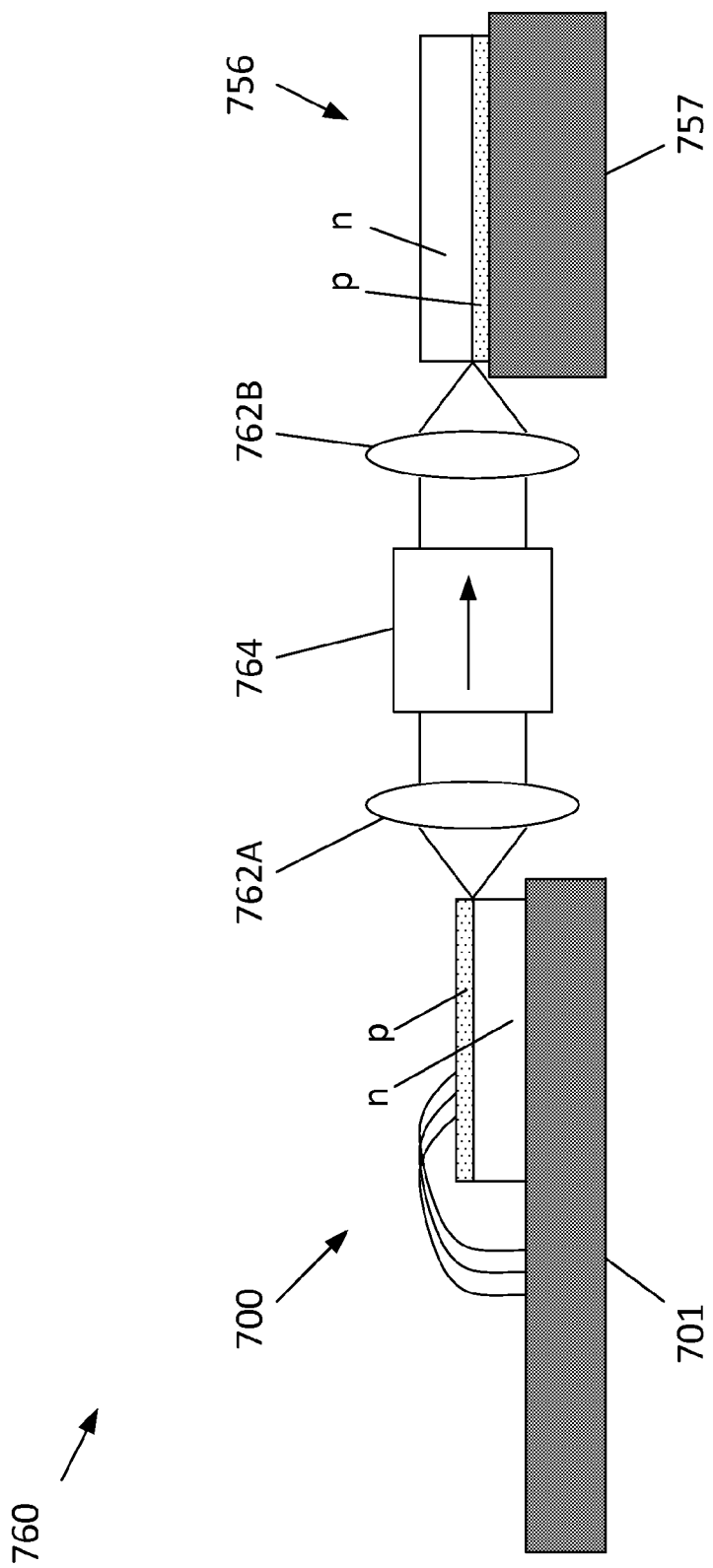
FIG. 7 schematically illustrates laser-SOA arrangement have a tunable multi-mode laser and a SOA are assembled with an optical isolator.

Alternatively it may be advantageous to provide an optical isolator between the laser output and the SOA. FIG. 7 illustrates such a tunable multi-mode laser-SOA assembly 760, in which a tunable multi-mode laser chip 700 is mounted on a laser submount 701 and is optically coupled to a SOA 756 that is mounted on a SOA submount 757 through a pair of lenses 762A and 762B and an optical isolator 764. The tunable multi-mode laser chip 700 is mounted with the substrate facing the submount 701, which enables access to the control electrodes of the laser 700 (e.g. electrodes 122A to 122H in FIG. 1) by a wire-bonding process. The SOA 756 is mounted onto the submount 757 with the substrate facing away from the submount, which provides enhanced thermal dissipation from the SOA into the submount during use.

A laser according to any embodiment may be built into a Raman amplification pump system as the laser source.

The figures provided herein are schematic and not to scale.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A widely tunable multi-mode semiconductor laser containing only two electrically active sections, being
   an optical gain section and
   a tunable distributed Bragg reflector section that reflects at a plurality of wavelengths,
   wherein the gain section is bounded by the tunable distributed Bragg reflector section and a broadband facet reflector, and
   wherein the tunable distributed Bragg reflector section comprises at least three discrete segments that are selectively tuned, and the discrete segments have respective portions of grating that have different pitches in a passive state, and
   wherein the reflection spectra of one or more segments of the tunable distributed Bragg reflector section is tuned lower in wavelength to correspond with the reflection spectrum of a further segment of the tunable distributed Bragg reflector section to provide a wavelength range of enhanced reflectivity.

2. The widely tunable multi-mode semiconductor laser according to claim 1, wherein the laser is configured for lasing on at least five longitudinal cavity modes in use.

3. The widely tunable multi-mode semiconductor laser according to claim 1, wherein the half-height wavelength range of the intensity of the reflection spectrum of each segment is greater than five times a corresponding mode spacing of a laser cavity formed with said segment in use.

4. The widely tunable multi-mode semiconductor laser according to claim 1, comprising regions without electrical contacts or gratings bounded by the tunable distributed Bragg reflector section and the broadband facet reflector, the electrically passive section having a length of at least 100 µm.

5. The widely tunable multi-mode semiconductor laser according to claim 4, further comprising an electrically passive section bounded by the tunable distributed Bragg reflector section and the broadband facet reflector, having a composite length of at least 100 µm.

6. The widely tunable multi-mode semiconductor laser according to claim 1, wherein the segments of the tunable distributed Bragg reflector section each comprise a segment of grating and the segments of the tunable distributed Bragg reflector section are arranged with a monotonic variation of grating pitch along the length of the tunable distributed Bragg reflector section.

7. The widely tunable multi-mode semiconductor laser according to claim 1, wherein the tunable distributed Bragg reflector section comprises a chirped grating.

8. The widely tunable multi-mode semiconductor laser according to claim 7, wherein the tunable distributed Bragg reflector section is a substantially linearly chirped grating.

9. The widely tunable multi-mode semiconductor laser according to claim 7, wherein the grating has a pitch, and is chirped such that the inverse of the pitch varies linearly along the length of the grating.

10. The widely tunable multi-mode semiconductor laser according to claim 7, wherein the grating comprises chirped grating segments that do not provide a contiguous range of grating pitches.

11. The widely tunable multi-mode semiconductor laser according to claim 1, wherein the segments of the tunable distributed Bragg reflector section each comprise a segment of grating of constant pitch.

12. The widely tunable multi-mode semiconductor laser according to claim 1, wherein the laser is monolithically integrated with an optical splitter, configured to split light output from the laser into two waveguide arms, a polarisation rotator on one of the waveguide arms, and a semiconductor optical amplifier on each waveguide arm.

13. A Raman amplification pump system comprising a light source that is the widely tunable multi-mode semiconductor laser according to claim 1.

14. The widely tunable multi-mode semiconductor laser according to claim 1, further comprising:
   a controller configured to tune the reflection spectra of the one or more segments of the tunable distributed Bragg reflector section to a lower wavelength to correspond with the reflection spectrum of a further segment of the tunable distributed Bragg reflector section to provide a wavelength range of enhanced reflectivity.

15. The widely tunable multi-mode semiconductor laser according to claim 1, wherein the tunable distributed Bragg reflector section comprises more than five discrete segments that are selectively tuned, and the discrete segments have respective portions of grating that have different pitches in the passive state.

* * * * *